(12) United States Patent
Chen et al.

(10) Patent No.: US 12,107,572 B2
(45) Date of Patent: Oct. 1, 2024

(54) SWITCH DEVICE WHERE CHARGES ACCUMULATED AT CONTROL TERMINALS OF SWITCH UNITS CAN BE DISCHARGED AND/OR NEUTRALIZED VIA SUB-SWITCH UNITS

(71) Applicant: RichWave Technology Corp., Taipei (TW)

(72) Inventors: Chih-Sheng Chen, Taipei (TW); Hsien-Huang Tsai, Taipei (TW); Meng-Lun Li, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 18/091,343

(22) Filed: Dec. 29, 2022

(65) Prior Publication Data

US 2024/0204769 A1 Jun. 20, 2024

(30) Foreign Application Priority Data

Dec. 14, 2022 (TW) .................................. 111147999

(51) Int. Cl.
*H03K 17/14* (2006.01)
*H03K 17/04* (2006.01)
(Continued)

(52) U.S. Cl.
CPC ... *H03K 17/102* (2013.01); *H03K 2217/0054* (2013.01)

(58) Field of Classification Search
None
See application file for complete search history.

(56) References Cited

U.S. PATENT DOCUMENTS 5,297,104 A 3/1994 Nakashima
5,680,300 A 10/1997 Szepesi
(Continued)

FOREIGN PATENT DOCUMENTS

CN 104866888 A 8/2015
TW 201044782 A1 12/2010
(Continued)

OTHER PUBLICATIONS

Office action mailed on Sep. 27, 2023 for the U.S. Appl. No. 18/089,580, filed Dec. 28, 2022, p. 1-14, Sep. 27, 2023.
(Continued)

*Primary Examiner* — Kenneth B Wells
(74) *Attorney, Agent, or Firm* — Winston Hsu

(57) ABSTRACT

A switch device includes a first switch unit, a second switch unit, a first sub-switch unit, a second sub-switch unit, a first resistor and a second resistor. The first switch unit is coupled to a radio-frequency terminal and coupled to the second switch unit in cascode. The first sub-switch unit is coupled to the second sub-switch unit in cascode. The first sub-switch unit is further coupled between control terminals of the first switch unit and the second switch unit. The first sub-switch unit is further coupled to a node between the first resistor and the first switch unit. The second sub-switch unit is further coupled to a node between the second resistor and the second switch unit. When the first switch unit and the second switch unit are transitioned, the first sub-switch unit and the second sub-switch unit can be turned on to discharge and/or neutralize accumulated charges.

20 Claims, 10 Drawing Sheets

(51) Int. Cl.
*H03K 17/041* (2006.01)
*H03K 17/10* (2006.01)
*H03K 17/16* (2006.01)
*H03K 17/68* (2006.01)

(56) References Cited

U.S. PATENT DOCUMENTS

| | | | |
|---|---|---|---|
| 5,929,665 | A | 7/1999 | Ichikawa |
| 5,986,484 | A | 11/1999 | Kimata |
| 6,016,281 | A | 1/2000 | Brox |
| 6,271,708 | B1 | 8/2001 | Hoshi |
| 6,333,665 | B1 | 12/2001 | Ichikawa |
| 6,370,069 | B2 | 4/2002 | Brass |
| 6,535,020 | B1 | 3/2003 | Yin |
| 7,519,135 | B2 | 4/2009 | Staszewski |
| 7,710,187 | B2 | 5/2010 | Hiyama |
| 8,138,818 | B2 | 3/2012 | Tsunoda |
| 8,203,377 | B2 | 6/2012 | Kelley |
| 8,963,576 | B2 | 2/2015 | Callanan |
| 9,019,001 | B2 | 4/2015 | Kelley |
| 9,100,019 | B2 | 8/2015 | Akiyama |
| 9,496,864 | B2 | 11/2016 | Wagoner |
| 9,621,153 | B2 | 4/2017 | Ikeda |
| 9,685,945 | B2 | 6/2017 | Osanai |
| 10,044,349 | B2 * | 8/2018 | Scott .............. H03K 17/693 |
| 10,270,437 | B2 * | 4/2019 | Scott .............. H03K 17/145 |
| 10,511,301 | B2 | 12/2019 | Akiyama |
| 10,523,194 | B2 | 12/2019 | Raszka |
| 10,680,601 | B1 | 6/2020 | Kempitiya |
| 10,848,145 | B2 | 11/2020 | Ishii |
| 11,258,443 | B2 | 2/2022 | Sahoo |
| 11,437,911 | B2 | 9/2022 | Duvnjak |
| 2009/0066402 | A1 | 3/2009 | Hiyama |
| 2009/0167368 | A1 | 7/2009 | Chan |
| 2013/0076322 | A1 | 3/2013 | Tateno |
| 2022/0310148 | A1 | 9/2022 | Ikeda |

FOREIGN PATENT DOCUMENTS

| | | |
|---|---|---|
| TW | I348270 | 9/2011 |
| TW | 201242231 A1 | 10/2012 |
| TW | 201532388 A | 8/2015 |
| TW | I575872 B | 3/2017 |
| TW | 202111551 A | 3/2021 |
| TW | 202203590 A | 1/2022 |

OTHER PUBLICATIONS

Tsai, the specification, including the claims, and drawings in the U.S. Appl. No. 18/089,580 , Filing Date: Dec. 28, 2022.
Office action mailed on Nov. 23, 2023 for the Taiwan application No. 111143672, filing date Nov. 16, 2022, pp. 1-4. ,Nov. 23, 2023.
Office action mailed on Jan. 23, 2024 for the Taiwan application No. 111147999, filing date Dec. 14, 2022, pp. 1-5. ,Jan. 23, 2024.
Office action mailed on Mar. 12, 2024 for the U.S. Appl. No. 18/089,580, filed Dec. 28, 2022, p. 1-14, Mar. 12, 2024.
Office action mailed on Jun. 11, 2024 for the U.S. Appl. No. 18/089,580, filed Dec. 28, 2022, p. 1-8.

\* cited by examiner

SWITCH DEVICE WHERE CHARGES ACCUMULATED AT CONTROL TERMINALS OF SWITCH UNITS CAN BE DISCHARGED AND/OR NEUTRALIZED VIA SUB-SWITCH UNITS

TECHNICAL FIELD

The disclosure is related to a switch device, and more particularly, a switch device where charges accumulated at control terminals of switch units can be discharged and/or neutralized via sub-switch units.

BACKGROUND

Regarding voltage generation, the generated voltage may be a positive voltage or a negative voltage used for controlling another circuit.

Usually, a negative voltage can be generated by a charge pump. The sourcing capability of the circuit generating a negative voltage is often weaker, so the generated negative voltage is easily affected by the discharge of accumulated positive charges. When the signal level of a terminal outputting a voltage is changed from a positive signal level to a negative signal level, accumulated positive charges often flow to the terminal to erroneously increase the generated negative voltage. Then, the generated negative voltage is too high which erroneously operates the controlled circuit.

Likewise, when the signal level of a terminal outputting a voltage is changed from a negative signal level to a positive signal level, accumulated negative charges often flow to the terminal to erroneously decrease the generated positive voltage, hence the generated positive voltage is too low. Hence, a solution is in need for improving the quality of the provided voltage and reducing erroneous operations.

SUMMARY

An embodiment provides a switch device including a first switch unit, a second switch unit, a first resistor, a second resistor, a first sub-switch unit and a second sub-switch unit. The first switch unit comprises a first terminal coupled to a first radio frequency terminal, a control terminal, and a second terminal. The second switch unit comprises a first terminal coupled to the second terminal of the first switch unit, a control terminal, and a second terminal coupled to a second radio frequency terminal. The first resistor comprises a first terminal configured to receive a first switch control signal, and a second terminal coupled to the control terminal of the first switch unit. The second resistor comprises a first terminal configured to receive a second switch control signal, and a second terminal coupled to the control terminal of the second switch unit. The first sub-switch unit comprises a first terminal coupled to a node between the control terminal of the first switch unit and the first resistor, a control terminal configured to receive a first sub-switch control signal, and a second terminal. The second sub-switch unit comprises a first terminal coupled to a node between the control terminal of the second switch unit and the second resistor, a control terminal configured to receive a second sub-switch control signal, and a second terminal coupled to a first reference voltage terminal. The first switch unit and the second switch unit are controlled according to the first switch control signal and the second switch control signal respectively to be turned on or turned off concurrently, and the first sub-switch unit and the second sub-switch unit are controlled according to the first sub-switch control signal and the second sub-switch control signal respectively to be turned on or turned off concurrently.

Another embodiment provides a switch device including a first switch unit, a second switch unit, a first resistor, a second resistor, a first sub-switch unit, a second sub-switch unit, a third switch unit, a fourth switch unit, a third resistor, a fourth resistor, a fourth sub-switch unit, a fifth sub-switch unit and a seventh sub-switch unit. The first switch unit comprises a first terminal coupled to a first radio frequency terminal, a control terminal, and a second terminal. The second switch unit comprises a first terminal coupled to the second terminal of the first switch unit, a control terminal, and a second terminal coupled to a second radio frequency terminal. The first resistor comprises a first terminal configured to receive a first switch control signal, and a second terminal coupled to the control terminal of the first switch unit. The second resistor comprises a first terminal configured to receive a second switch control signal, and a second terminal coupled to the control terminal of the second switch unit. The first sub-switch unit comprises a first terminal coupled to a node between the control terminal of the first switch unit and the first resistor, a control terminal configured to receive a first sub-switch control signal, and a second terminal. The second sub-switch unit comprises a first terminal coupled to a node between the control terminal of the second switch unit and the second resistor, a control terminal configured to receive a second sub-switch control signal, and a second terminal. The third switch unit comprises a first terminal coupled to the first radio frequency terminal, a control terminal, and a second terminal. The fourth switch unit comprises a first terminal coupled to the second terminal of the third switch unit, a control terminal, and a second terminal coupled to a third radio frequency terminal. The third resistor comprises a first terminal configured to receive a third switch control signal, and a second terminal coupled to the control terminal of the third switch unit. The fourth resistor comprises a first terminal configured to receive a fourth switch control signal, and a second terminal coupled to the control terminal of the fourth switch unit. The fourth sub-switch unit comprises a first terminal coupled to a node between the control terminal of the third switch unit and the third resistor, a control terminal configured to receive a fourth sub-switch control signal, and a second terminal. The fifth sub-switch unit comprises a first terminal coupled to a node between the control terminal of the fourth switch unit and the fourth resistor, a control terminal configured to receive a fifth sub-switch control signal, and a second terminal. The seventh sub-switch unit comprises a first terminal coupled to the second terminal of the second sub-switch unit, a control terminal configured to receive a seventh sub-switch control signal, and a second terminal coupled to the second terminal of the fifth sub-switch unit. The first switch unit and the second switch unit are controlled according to the first switch control signal and the second switch control signal respectively to be turned on or turned off concurrently, and the first sub-switch unit and the second sub-switch unit are controlled according to the first sub-switch control signal and the second sub-switch control signal respectively to be turned on or turned off concurrently. The third switch unit and the fourth switch unit are controlled according to the third switch control signal and the fourth switch control signal respectively to be turned on or turned off concurrently, and the fourth sub-switch unit and the fifth sub-switch unit are controlled according to the fourth sub-switch control signal and the fifth sub-switch control signal respectively to be turned on or turned off concurrently.

DETAILED DESCRIPTION

Figure 1:
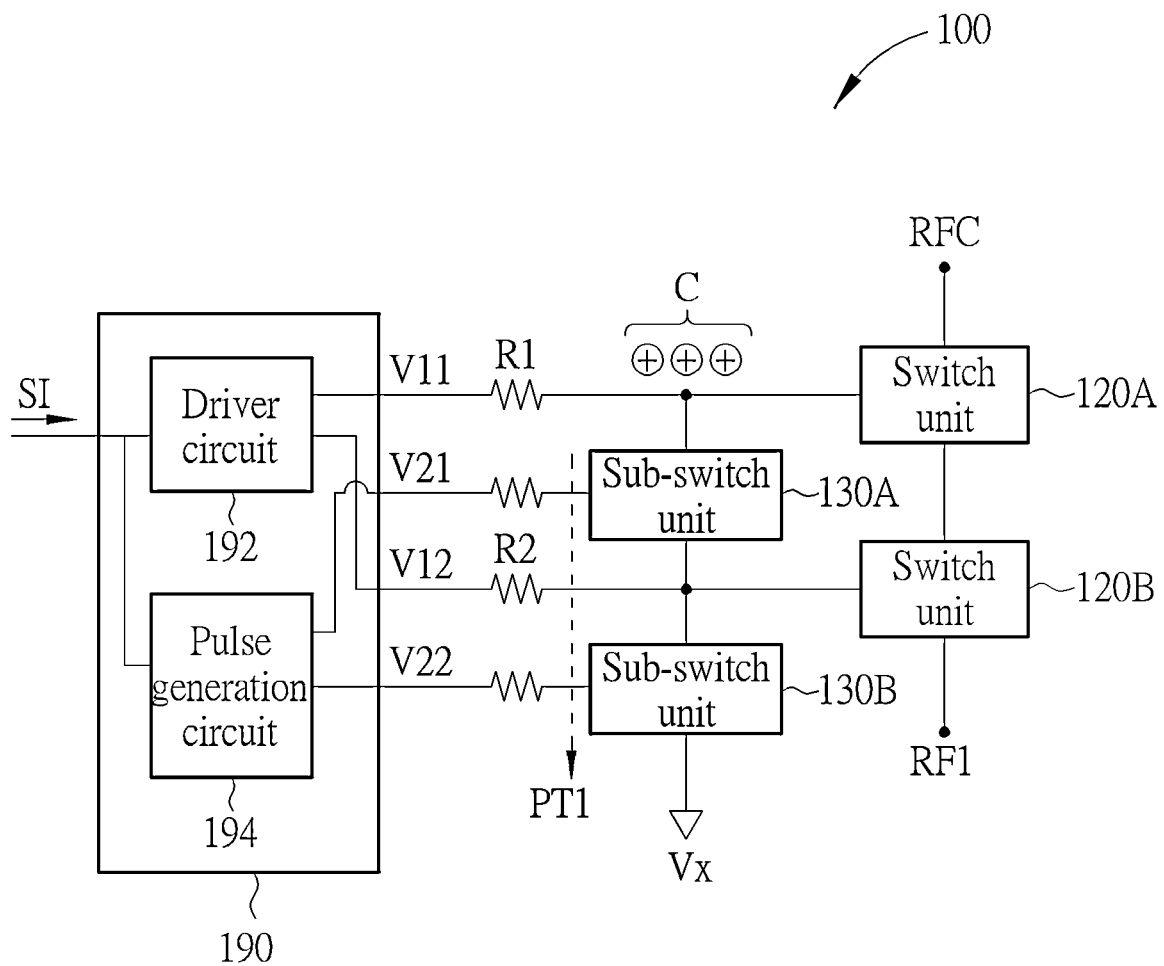
FIG. 1 illustrates a switch device according to an embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

In order to generate stable voltages, prevent the signal level of the generated negative voltages from being too high, prevent the signal level of the generated positive voltages from being too low, and make voltage signals of control terminals of switch units reach the target signal levels faster, switch devices described below can be used. In the text, each of the switch units can include a first terminal, a second terminal and a control terminal. Each of the sub-switch units can include a first terminal, a second terminal and a control terminal. Each resistor can include a first terminal and a second terminal. In the text, the switch units and/or the sub-switch units being turned on or turned off concurrently could mean that these switch units and/or these sub-switch units being all turned on or turned off at least in one time period.

FIG. 1 illustrates a switch device 100 according to an embodiment. The switch device 100 can include switch units 120A and 120B, resistors R1 and R2 and sub-switch units 130A and 130B.

The switch unit 120A can include a first terminal coupled to a radio frequency (RF) terminal RFC, a control terminal, and a second terminal. The switch unit 120B can include a first terminal coupled to the second terminal of the switch unit 120A, a control terminal, and a second terminal coupled to a second radio frequency terminal RF1. The resistor R1 can include a first terminal used to receive a switch control signal V11, and a second terminal coupled to the control terminal of the switch unit 120A. The resistor R2 can include a first terminal used to receive a switch control signal V12, and a second terminal coupled to the control terminal of the switch unit 120B. The sub-switch unit 130A can include a first terminal coupled to a node between the control terminal of the switch unit 120A and the resistor R1, a control terminal used to receive a sub-switch control signal V21, and a second terminal coupled to the control terminal of the switch unit 120B. The sub-switch unit 130B can include a first terminal coupled to a node between the control terminal of the switch unit 120B and the resistor R2, a control terminal used to receive a sub-switch control signal V22, and a second terminal coupled to a reference voltage terminal Vx.

The switch units 120A and 120B can be controlled according to the switch control signals V11 and V12 respectively to be turned on or turned off concurrently. The sub-switch units 130A and 130B can be controlled according to the sub-switch control signals V21 and V22 respectively to be turned on or turned off concurrently. Through the structure of FIG. 1, when the switch control signals V11 and V12 are changed from a signal level (e.g. one of a positive voltage and a negative voltage) to another signal level (e.g. the other one of the positive voltage and the negative voltage), the sub-switch control signals V21 and V22 can be controlled to turn on the sub-switch units 130A and 130B for a period. Hence, the charges C accumulated at the control terminal(s) of the switch unit 120A and/or the switch unit 120B can be discharged to the reference voltage terminal Vx through the path PT1. As a result, the voltage provided by a voltage source can be prevented from being too high or too low. For example, the sub-switch units 130A and 130B can be turned on for 50 nanoseconds. By having the sub-switch unit 130B, the risk of a breakdown of the sub-switch unit 130A is reduced.

The switch control signals V11 and V12 can be the same or different (e.g. the waveforms or voltage levels can be slightly different) as long as the switch units 120A and 120B are turned on and turned off concurrently. Likewise, the sub-switch control signals V21 and V22 can be the same or different (e.g. the waveforms or voltage levels can be slightly different) as long as the sub-switch units 130A and 130B are turned on and turned off concurrently.

The switch device 100 can further include a control circuit 190. The control circuit 190 can be coupled to the first terminal of the resistor R1, the first terminal of the resistor R2 and the control terminals of the sub-switch units 130A and 130B. The control circuit 190 can be used to generate the switch control signals V11 and V12 and the sub-switch control signals V21 and V22 according to an input signal SI.

The control circuit 190 can include a driver circuit 192 and a pulse generation circuit 194. The driver circuit 192 can output the switch control signals V11 and V12 according to the input signal SI. The pulse generation circuit 194 can output the sub-switch control signals V21 and V22 according to the input signal SI. The current or voltage of the input signal SI may be insufficient to drive the switch unit 120A and/or the switch unit 120B, and the voltage and current of the switch control signal V11 and/or the switch control signal V12 are sufficient to drive the switch unit 120A and/or the switch unit 120B.

Figure 2:
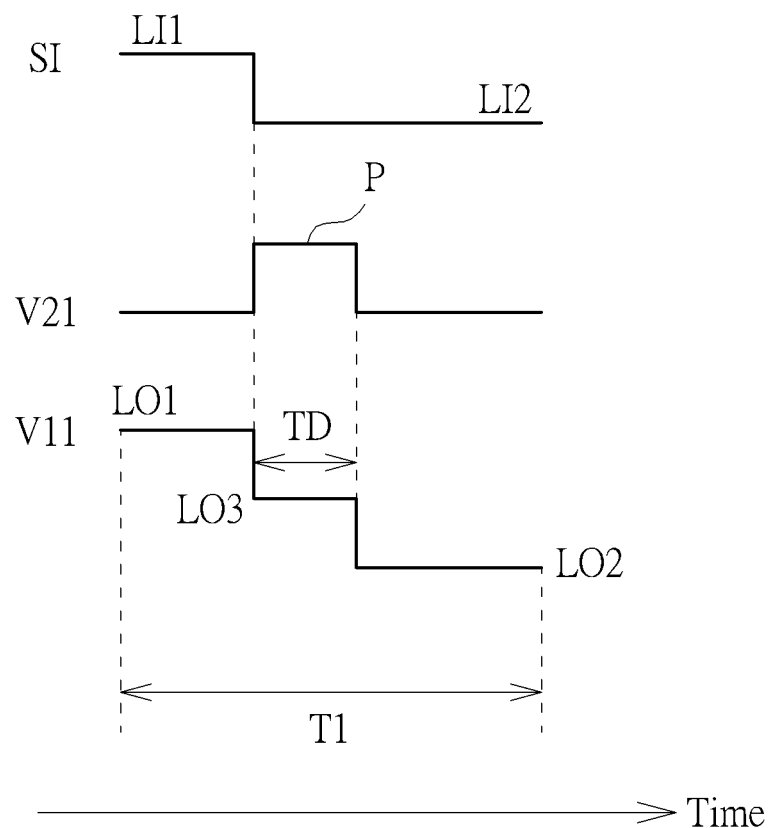
FIG. 2 illustrates waveforms of signals in FIG. 1.

FIG. 2 illustrates waveforms of the input signal SI, the switch control signal V11 and the sub-switch control signal V21 in FIG. 1. Here, it is assumed that the switch control signals V11 and V12 are the same, and the sub-switch control signals V21 and V22 are the same, so the switch control signal V12 and the sub-switch control signal V22 are not shown in FIG. 2. In a transition period T1 where the switch control signal V11 is transitioned from a first output signal level LO1 to a second output signal level LO2, the sub-switch control signal V21 can have a pulse P to turn on the sub-switch unit 130A and/or the sub-switch unit 130B. For example, the duration of the pulse P can be 50 nanoseconds.

In the transition period T1, the input signal SI can be transitioned from a first input signal level LI1 to a second input signal level LI2. The switch control signal V11 can be transitioned from the first output signal level LO1 to a third output signal level LO3, and then be transitioned to the second output signal level LO2. The third output signal level LO3 can be between the first output signal level LO1 and the second output signal level LO2.

In the first transition period T1 and before a predetermined period TD, the driver circuit 192 can output the switch control signal V11 having the first output signal level LO1 according to the first input signal level LI1 of the input signal SI.

In the predetermined period TD of the first transition period T1, the switch control signal V11 can be transitioned from the first output signal level LO1 to the third output signal level LO3. The predetermined period TD can be corresponding to the pulse P. For example, the predetermined period TD can be the same with the duration of the pulse P.

In the transition period T1 and after the predetermined period TD, the driver circuit 192 can output the switch control signal V11 having the second output signal level LO2 according to the second input signal level LI2 of the input signal SI.

The pulse generation circuit 194 can generate the pulse P when detecting the input signal SI is transitioned from the first input signal level LI1 to the second input signal level LI2.

The reference voltage terminal Vx can include a ground terminal or a reference voltage terminal having a sourcing ability, such as a voltage terminal of a low drop regulator (LDO) or a bandgap circuit. Hence, when the pulse P is applied to turn on the sub-switch units 130A and 130B, the reference voltage terminal Vx is capable of receiving the accumulated charges C.

In FIG. 1, the switch device 100 has two switch units (e.g. 120A and 120B) and two sub-switch units (130A and 130B), however, this is an example. According to embodiments, the switch device 100 can include a plurality of switch units coupled in cascode and a plurality of sub-switch units coupled in cascode, as described below.

Figure 3:
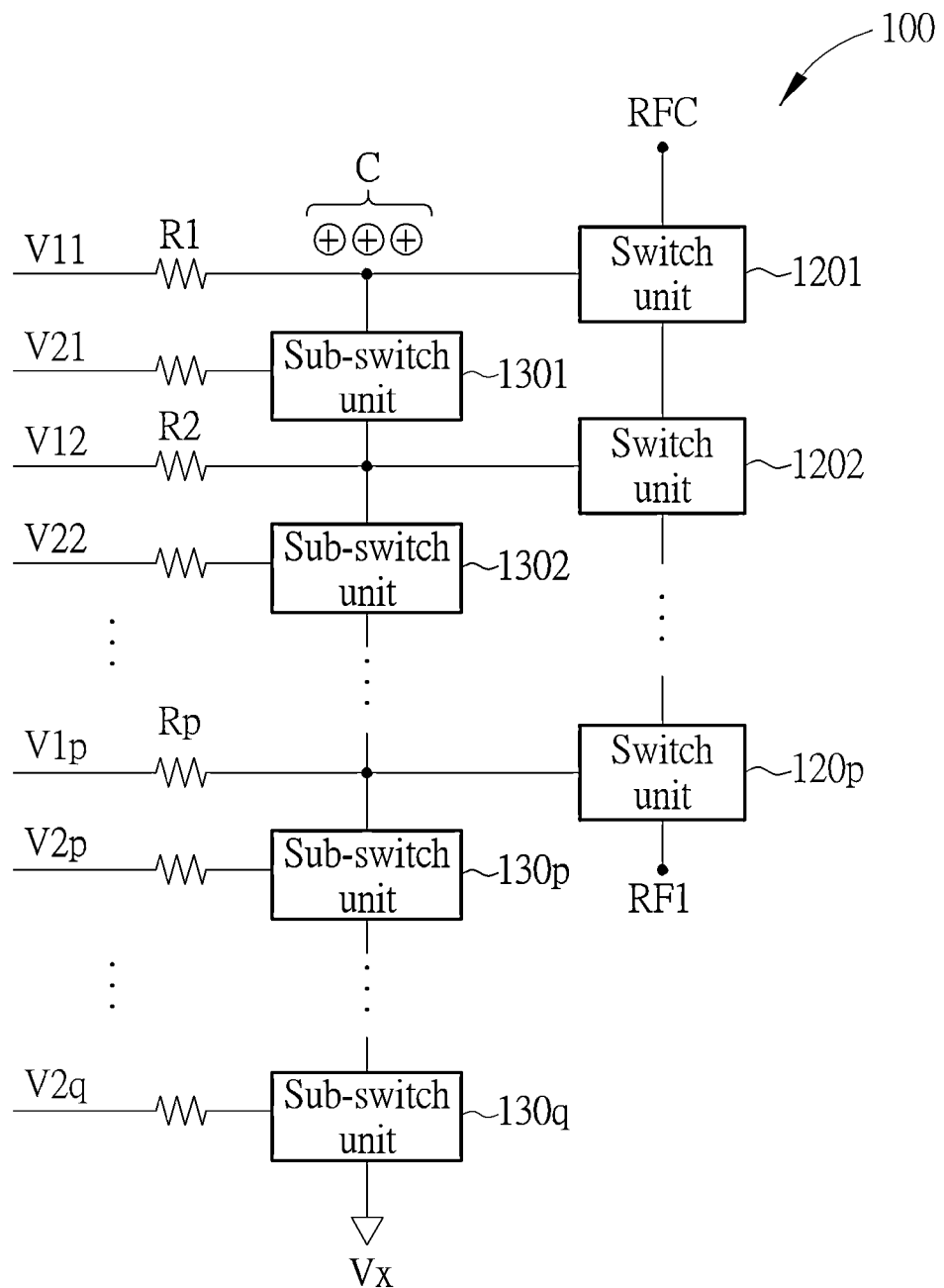
FIG. 3 illustrates a switch device according to another embodiment.

FIG. 3 illustrates the switch device 100 including p switch units 1201 to 120p, p resistors R1 to Rp, and q sub-switch units 1301 to 130q according to another embodiment, where p and q are integers larger than 2.

Like FIG. 1, the switch units 1201 to 120p can be controlled by switch control signals V11 to V1p respectively to be turned on or turned off concurrently. The sub-switch units 1301 to 130q can be controlled by sub-switch control signals V21 to V2q respectively to be turned on or turned off concurrently. When the switch units 1201 to 120p are transitioned (e.g. from an ON state to an OFF state, or from the OFF state to the ON state), the sub-switch control signals V21 to V2q can have pulses to turn on the sub-switch units 1301 to 130q for a short period to discharge the accumulated charges C to the reference voltage terminal Vx. Through the plurality of sub-switch units 1301 to 130q coupled in cascode, the breakdown of the transistors of the sub-switch units caused by excessive voltage swing is prevented.

Figure 4:
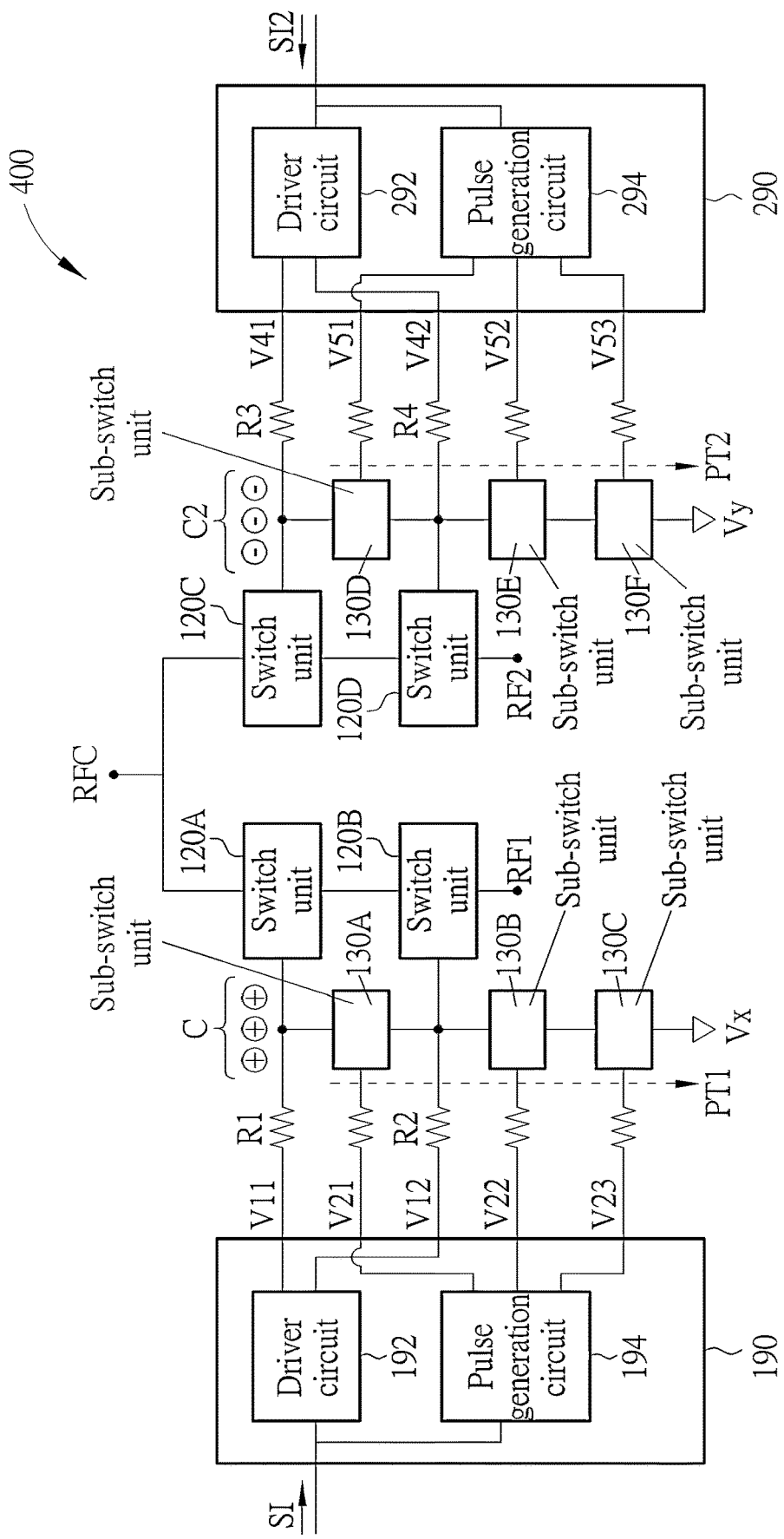
FIG. 4 illustrates a switch device according to another embodiment.

FIG. 4 illustrates a switch device 400 according to another embodiment. Compared with the switch device 100, the switch device 400 has a symmetrical structure and can further include a sub-switch unit 130C. The sub-switch unit 130C can include a first terminal coupled to the second terminal of the sub-switch unit 130B, a control terminal used to receive a sub-switch control signal V23, and a second terminal coupled to the reference voltage terminal Vx. The sub-switch control signal V23 can be generated by the pulse generation circuit 194 or another circuit with similar functions. The sub-switch unit 130B is coupled to the reference voltage terminal Vx through the sub-switch unit 130C. When the switch control signal V11 is transitioned from a first signal level to a second signal level, the sub-switch control signal V23 can have a pulse to turn on the sub-switch unit 130C to discharge the charges C to the reference voltage terminal Vx. By having the sub-switch unit 130C, the risk of breakdown of the sub-switch units 130A and 130B is reduced.

If the sub-switch units 130B and 130C belong to the same type, for example, both are formed with n-type transistors or both are formed with p-type transistors, the sub-switch control signals V22 and V23 can be the same. If the sub-switch units 130B and 130C belong to different types, for example, one is formed with an n-type transistor and the other is formed with a p-type transistor, the sub-switch control signals V22 and V23 can be complementary to one another.

The switch device 400 can further include switch units 120C and 120D, resistors R3 and R4, and sub-switch units 130D, 130E and 130F. The switch unit 120C can include a first terminal coupled to the radio frequency terminal RFC, a control terminal, and a second terminal. The switch unit 120D can include a first terminal coupled to the second terminal of the switch unit 120C, a control terminal, and a second terminal coupled to a radio frequency terminal RF2. The resistor R3 can include a first terminal used to receive a switch control signal V41, and a second terminal coupled to the control terminal of the switch unit 120C. The resistor R4 can include a first terminal used to receive a switch control signal V42, and a second terminal coupled to the control terminal of the switch unit 120D. The sub-switch unit 130D can include a first terminal coupled to a node between the control terminal of the switch unit 120C and the resistor R3, a control terminal used to receive a sub-switch control signal V51, and a second terminal. The sub-switch unit 130E can include a first terminal, a second terminal and a control terminal, where the first terminal is coupled to a node between the control terminal of the switch unit 120D and the resistor R4 and coupled to the second terminal of the sub-switch unit 130D, and the control terminal is used to receive a sub-switch control signal V52. The sub-switch unit 130F can include a first terminal coupled to the second terminal of the sub-switch unit 130E, a control terminal used to receive a sub-switch control signal V53, and a second terminal coupled to a reference voltage terminal Vy. Each of the reference voltage terminal Vx and the reference voltage terminal Vy can include a ground terminal or another reference voltage terminal having a sourcing ability.

In FIG. 4, the switch units 120C and 120D can be controlled according to the switch control signals V41 and V42 respectively to be turned on or turned off concurrently. The sub-switch units 130D and 130E can be controlled according to the sub-switch control signals V51 and V52 respectively to be turned on or turned off concurrently.

When the switch control signal V11 is transitioned from a first signal level to a second signal level (e.g. from +2 volts to −2 volts), and the switch control signal V41 is transitioned from a third signal level to a fourth signal level (e.g. from −2 volts to +2 volts), the sub-switch control signals V51 and V53 can have pulses to turn on the sub-switch units 130D and 130F to discharge the accumulated charges C2 to the reference voltage terminal Vy through a path PT2.

If the sub-switch units 130D and 130F belong to the same type, for example, both are n-type transistors or both are p-type transistors, the sub-switch control signals V51 and V53 can be the same. If the sub-switch units 130D and 130F belong to different types, for example, one is an n-type transistor and the other is a p-type transistor, the sub-switch control signals V51 and V53 can be complementary to one another.

The switch control signals V41 and V42 and the sub-switch control signals V51, V52 and V53 can be generated by a control circuit 290 according to an input signal SI2. Like the control circuit 190, the control circuit 290 can include a driver circuit 292 and a pulse generation circuit 294. The structure and operations of the control circuit 290 can be similar to that of the control circuit 190 and are not repeatedly described.

Figure 5:
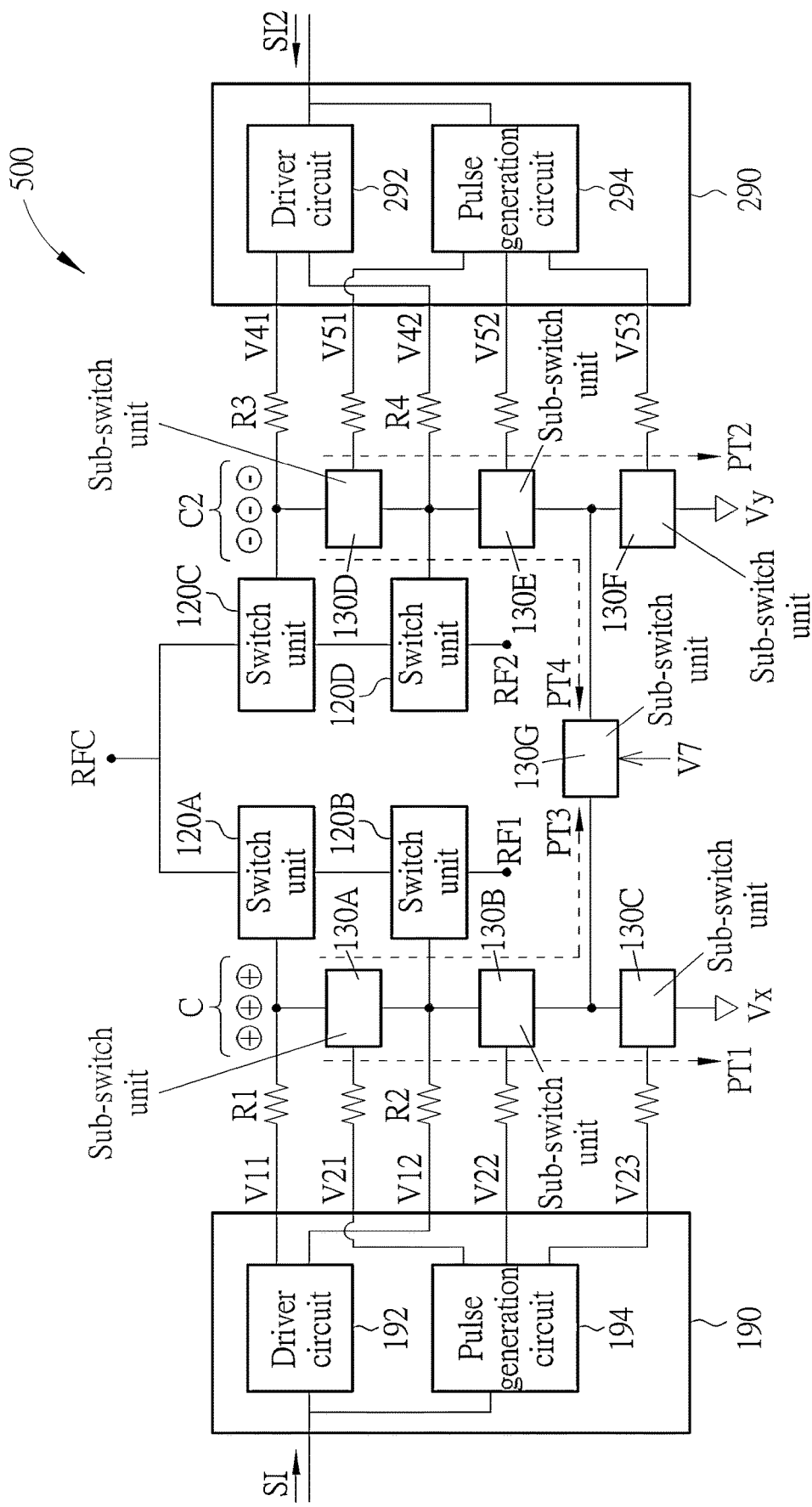
FIG. 5 illustrates a switch device according to another embodiment.

FIG. 5 illustrates a switch device 500 according to an embodiment. Compared with the switch device 400, the switch device 500 can further include a sub-switch unit 130G. The sub-switch unit 130G can include a first terminal coupled to the first terminal of the sub-switch unit 130C, a control terminal used to receive a sub-switch control signal V7, and a second terminal coupled to the first terminal of the sub-switch unit 130F.

Figure 6:
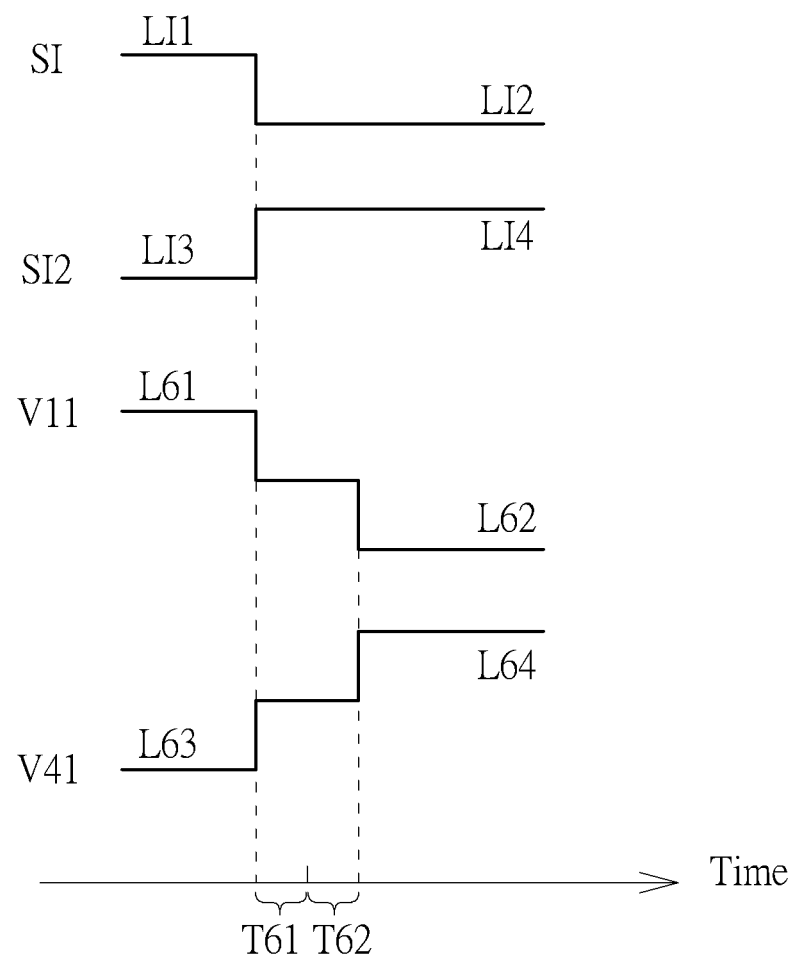
FIG. 6 illustrates waveforms of signals in FIG. 5.

FIG. 6 illustrates waveforms of the signals of the switch device 500 in FIG. 5. When the input signal SI is transitioned from the first input signal level LI1 to the second input signal level LI2, the input signal SI2 is transitioned from a third input signal level LI3 to a fourth input signal level LI4, the switch control signal V11 is transitioned from a first output signal level L61 to a second output signal level L62, and the switch control signal V41 is transitioned from a third output signal level L63 to a fourth output signal level L64, the following operations can be performed.

In a first period T61, a first operation can be performed. In a second period T62 following the first period T61, a second operation can be performed. The first operation and the second operation can be as described in Table 1:

TABLE 1

| The first operation | The sub-switch control signals V21 and V22 can be controlled to turn on the sub-switch units 130A and 130B. The sub-switch control signal V23 can be controlled to turn on the sub-switch unit 130C. The sub-switch control signals V51 and V52 can be controlled to turn on the sub-switch units 130D and 130E. The sub-switch control signal V53 can be controlled to turn on the sub-switch unit 130F. The sub-switch control signal V7 can be controlled to turn off the sub-switch unit 130G. |
|---|---|
| The second operation | The sub-switch control signals V21 and V22 can be controlled to turn on the sub-switch units 130A and 130B. The sub-switch control signal V23 can be controlled to turn off the sub-switch unit 130C. The sub-switch control signals V51 and V52 can be controlled to turn on the sub-switch units 130D and 130E. The sub-switch control signal V53 can be controlled to turn off the sub-switch unit 130F. The sub-switch control signal V7 can be controlled to turn on the sub-switch unit 130G. |

Through the first operation, the accumulated charges C are discharged to the reference voltage terminal Vx through the path PT1, and the accumulated charges C2 are discharged to the reference voltage terminal Vy through the path PT2. Through the second operation, the remnants of the accumulated charges C flow through a path PT3, and the remnants of the accumulated charges C2 flow through a path PT4. Hence, the charges C and C2 neutralize one another to prevent the voltages provided by voltage sources from being too high or too low.

In another embodiment, the second operation can precede the first operation. For example, the second operation can be performed in the first period T61 to neutralize the accumulated charges, and then the first operation can be performed in the second period T62 to discharge the remaining charges.

Figure 7:
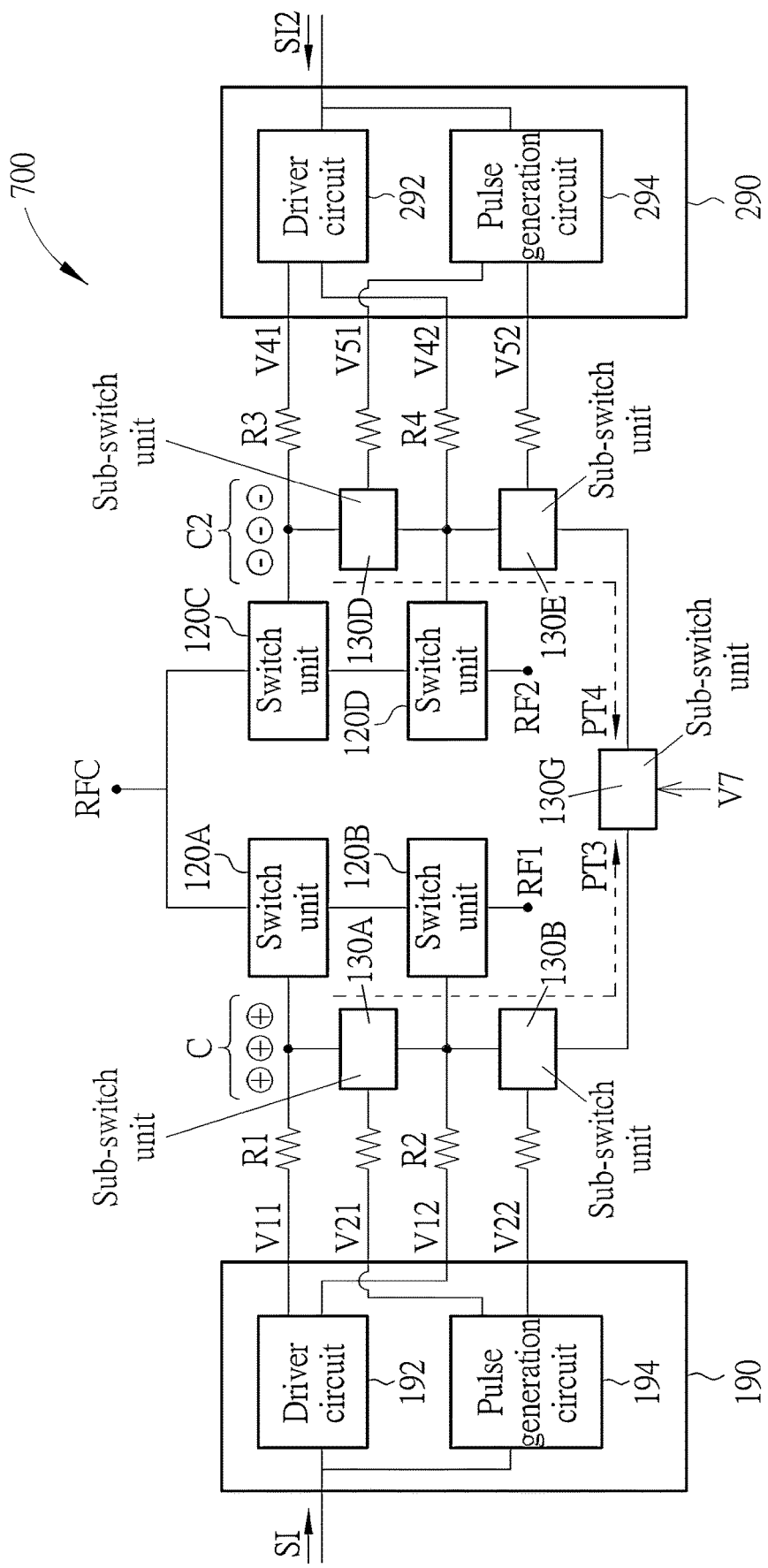
FIG. 7 illustrates a switch device according to another embodiment.

FIG. 7 illustrates a switch device 700 according to another embodiment. The switch device 700 can be similar to the switch device 500, but the sub-switch units 130C and 130F can be omitted in the switch device 700. Hence, in the switch device 700, the accumulated charges C and C2 are not discharged to reference voltage terminals. In FIG. 7, the charges C flow through the path PT3, and the charges C2 flow through the path PT4. Hence, the charges C and C2 neutralize one another to prevent the charges C and C2 from causing the voltages provided by voltage sources to be too high or too low.

In FIG. 7, the switch units 120A and 120B can be controlled according to the switch control signals V11 and V12 respectively to be turned on or turned off concurrently. The sub-switch units 130A and 130B can be controlled according to the sub-switch control signals V21 and V22 respectively to be turned on or turned off concurrently.

The switch units 120C and 120D can be controlled according to the switch control signals V41 and V42 respectively to be turned on or turned off concurrently. The sub-switch units 130D and 130E can be controlled according to the sub-switch control signals V51 and V52 respectively to be turned on or turned off concurrently.

The switch control signals V11 and V12 can be the same. The switch control signals V41 and V42 can be the same. The sub-switch control signals V21 and V22 can be the same. The sub-switch control signals V51 and V52 can be the same.

Figure 8:
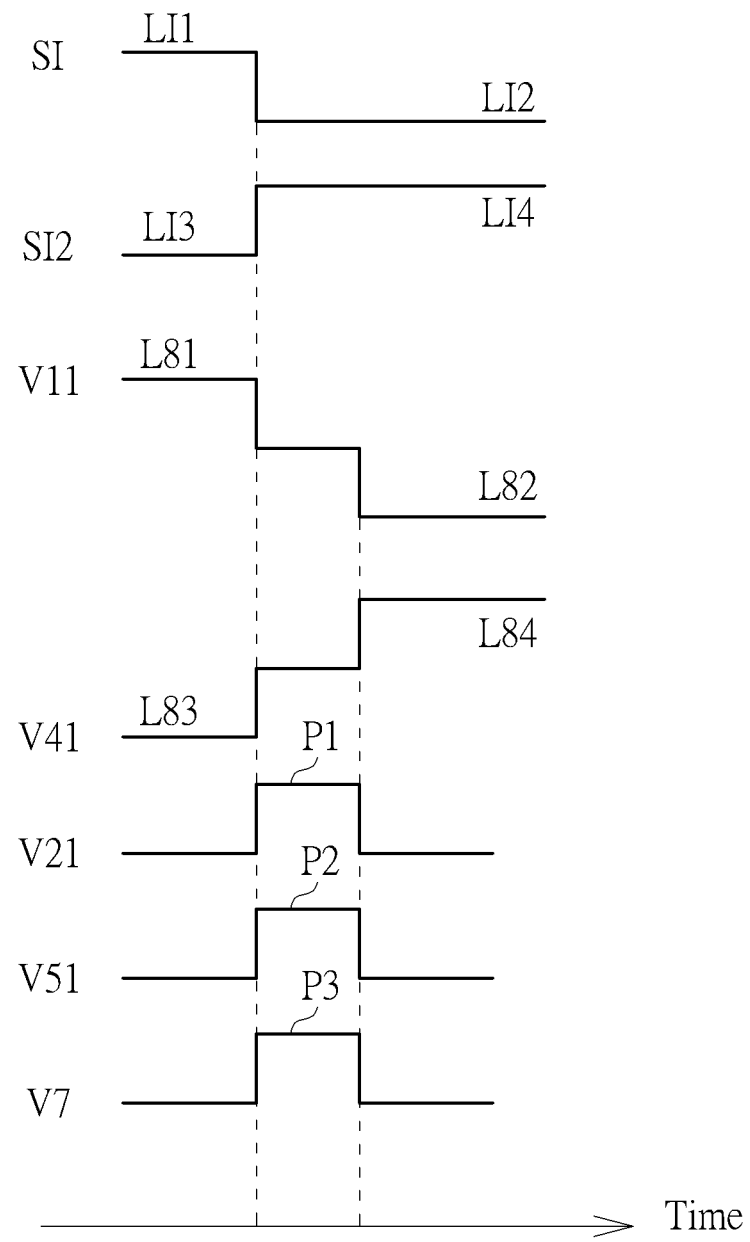
FIG. 8 illustrates waveforms of signals in FIG. 6.

FIG. 8 illustrates waveforms of the signals in FIG. 7. Here, it is assumed the switch control signals V11 and V12 are the same, the switch control signals V41 and V42 are the same, the sub-switch control signals V21 and V22 are the same, and the sub-switch control signals V51 and V52 are the same. Hence, the same signals are omitted in FIG. 8.

In FIG. 7 and FIG. 8, when the input signal SI is transitioned from the first input signal level LI1 to the second input signal level LI2, the input signal SI2 is transitioned from the third input signal level LI3 to the fourth input signal level LI4, the switch control signal V11 is transitioned from a first output signal level L81 to a second output signal level L82, and the switch control signal V41 is transitioned from a third output signal level L83 to a fourth output signal level L84, the sub-switch control signals V21, V51 and V7 can have pulses P1, P2 and P3 respectively to turn on the sub-switch units 130A, 130D and 130G.

When the sub-switch units 130A, 130B, 130D, 130E and 130G are turned on, the accumulated charges can be neutralized to prevent the voltages provided by voltage sources from being too high or too low. In addition, the switch control signals V11 and V41 can be pulled higher or pulled lower to reach the target signal levels faster.

Figure 9:
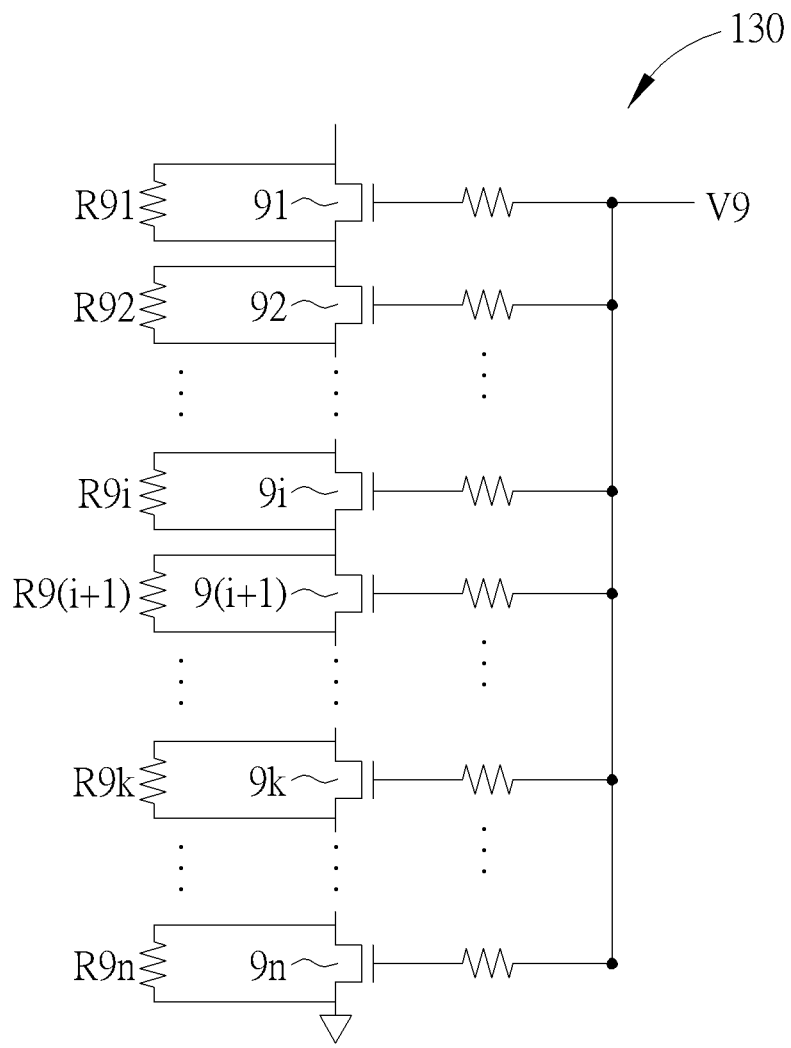
FIG. 9 illustrates a sub-switch unit according to an embodiment.

FIG. 9 illustrates a sub-switch unit 130 according to an embodiment. The sub-switch unit 130 can be each of the sub-switch units 130C, 130F and 130G. The sub-switch unit 130 can include n sub-switches 91 to 9$n$ and $n$ resistors R91 to R9$n$. A first terminal and a second terminal of a kth sub-resistor R9$k$ can be respectively coupled to a first terminal and a second terminal of a kth sub-switch 9$k$. Each of control terminals of the n sub-switches 91 to 9$n$ can receive a sub-switch control signal V9. For example, if the sub-switch unit 130 is the sub-switch unit 130C, the sub-switch control signal V9 can be the sub-switch control signal V23. If the sub-switch unit 130 is the sub-switch unit 130F, the sub-switch control signal V9 can be the sub-switch control signal V53. If the sub-switch unit 130 is the sub-switch unit 130G, the sub-switch control signal V9 can be the sub-switch control signal V7.

In the sub-switch unit 130, a first terminal of the first sub-switch 91 can be coupled to the first terminal of the sub-switch unit 130, a second terminal of an ith sub-switch 9$i$ can be coupled to a first terminal of an (i+1)th sub-switch 9(i+1), and a second terminal of the nth sub-switch 9$n$ can be coupled to the second terminal of the sub-switch unit 130, where n, k and i are integers, $0<k<(n+1)$ and $0<i<n$.

Figure 10:
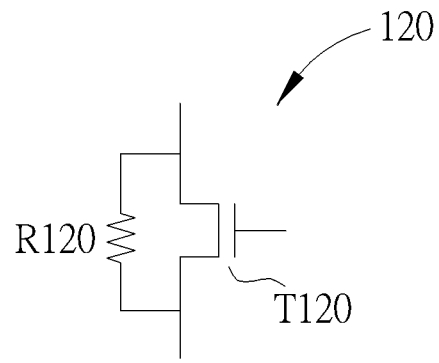
FIG. 10 illustrates a switch unit according to an embodiment.

FIG. 10 illustrates a switch unit 120 according to an embodiment. The switch unit 120 can be each of the switch units 120A, 120B, 120C, 120D and 1201 to 120$p$, and the sub-switch units 130A, 130B, 130C and 130D. The switch unit 120 can include a switch T120 and a resistor R120, where a first terminal and a second terminal of the switch T120 can be coupled to a first terminal and a second terminal of the resistor R120 respectively. A control terminal of the switch T120 can receive a corresponding switch control signal or sub-switch control signal.

Figure 11:
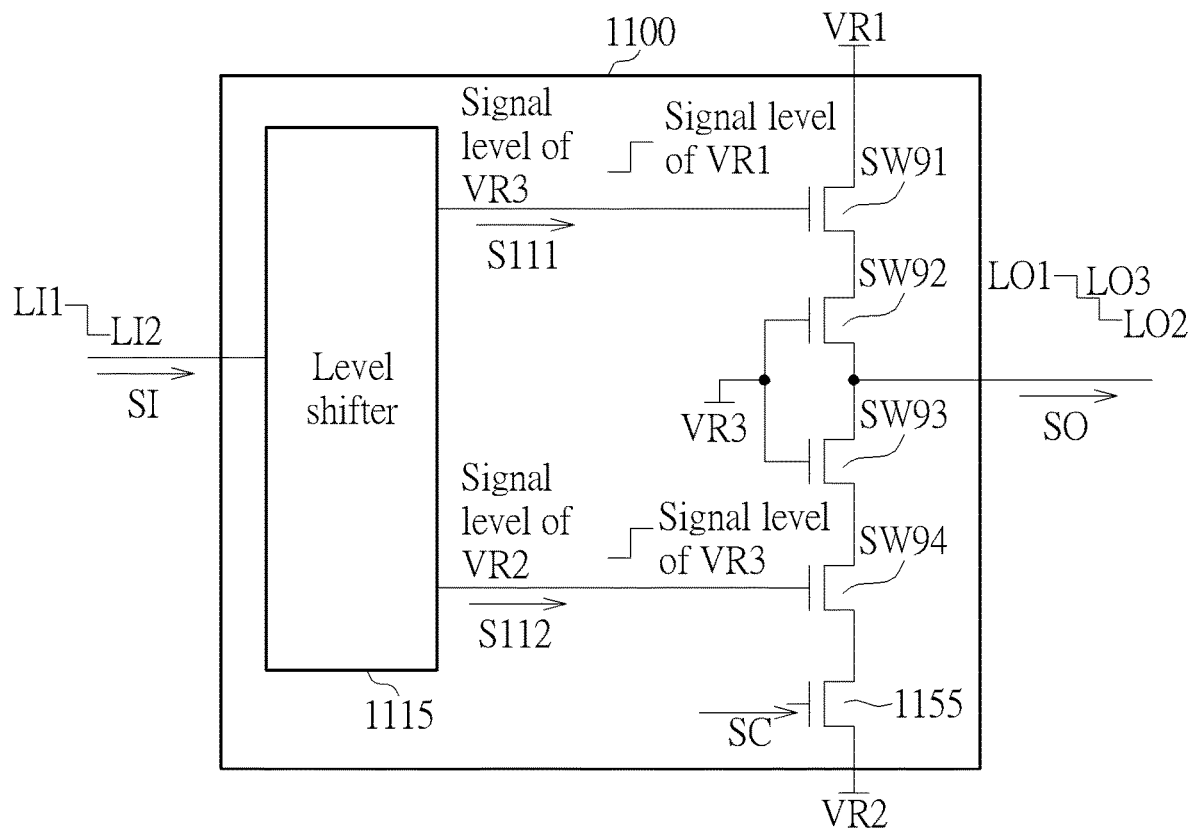
FIG. 11 illustrates a driver circuit 1100 according to an embodiment.

FIG. 11 illustrates a driver circuit 1100 according to an embodiment. In FIG. 1, FIG. 4, FIG. 5 and FIG. 7, each of the driver circuits 192 and 292 can have the structure of the driver circuit 1100. An output signal SO of the driver circuit 1100 can be corresponding to each of the switch control signals V11, V12, V41 and V42 in FIG. 1, FIG. 4, FIG. 5 and FIG. 7.

The structure and signal levels in FIG. 11 can be shown as an example, and embodiments are not limited thereto. The driver circuit 1100 can include a level shifter 1115 and switches SW91, SW92, SW93 and SW94. The level shifter 1115 can shift the signal level of the input signal SI to generate one or more control signal(s) with one signal level or different signal levels. The level shifter 1115 can be implemented according to a conventional design.

The couplings among the level shifter 1115 and the switches SW91, SW92, SW93 and SW94 can be as shown in FIG. 11. For example, the switches SW91 and SW92 can include P-type transistors, so they can be turned on by signals with a low voltage level. The switches SW93 and SW94 can include N-type transistors, so they can be turned on by signals with a high voltage level.

The level shifter 1115 can output control signals S111 and S112 to the switches SW91 and SW94 respectively according to the input signal SI. The control terminals of the switches SW92 and SW93 can be coupled to a reference terminal to receive a reference signal VR3.

When the input signal SI is transitioned from the first input signal level LI1 to the second input signal level LI2, the level shifter 1115 can transition the control signal S111 from a signal level of the reference signal VR3 to a signal level of a reference signal VR1, and transition the control signal S112 from a signal level of a reference signal VR2 to the signal level of the reference signal VR3.

If the reference signals VR1, VR2 and VR3 have a positive signal level, a negative signal level and a ground signal level respectively, the output signal SO can be transitioned from a high signal level to a low signal level. For example, the output signal SO can be transitioned from the first output signal level LO1 to the third output signal level LO3, and then to the second output signal level LO2 as shown in FIG. 11.

The driver circuit 1100 can further include the switch 1155 coupled to the switch SW94. The switch SW94 can be coupled to the reference voltage terminal providing the reference voltage VR2 through the switch 1155. In the abovementioned predetermined period TD, the switch 1155 can be turned off according to a control signal SC.

In summary, through the switch devices 100, 400, 500 and 700, the accumulated charges can be discharged to reference voltage terminals and/or neutralized. Hence, the voltages provided by voltage sources can be prevented from being affected to be too high or too low. When the switch control signals are transitioned, the switch control signals can be pulled high or pulled low to reach target signal levels faster. As a result, the performance of the circuit is improved, and erroneous operations are reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switch device, comprising:
   a first switch unit comprising a first terminal coupled to a first radio frequency terminal, a control terminal, and a second terminal;
   a second switch unit comprising a first terminal coupled to the second terminal of the first switch unit, a control terminal, and a second terminal coupled to a second radio frequency terminal;
   a first resistor comprising a first terminal configured to receive a first switch control signal, and a second terminal coupled to the control terminal of the first switch unit;
   a second resistor comprising a first terminal configured to receive a second switch control signal, and a second terminal coupled to the control terminal of the second switch unit;
   a first sub-switch unit comprising a first terminal coupled to a node between the control terminal of the first switch unit and the first resistor, a control terminal configured to receive a first sub-switch control signal, and a second terminal; and
   a second sub-switch unit comprising a first terminal coupled to a node between the control terminal of the second switch unit and the second resistor, a control terminal configured to receive a second sub-switch control signal, and a second terminal coupled to a first reference voltage terminal;
   wherein the first switch unit and the second switch unit are controlled according to the first switch control signal and the second switch control signal respectively to be turned on or turned off concurrently, and the first sub-switch unit and the second sub-switch unit are controlled according to the first sub-switch control signal and the second sub-switch control signal respectively to be turned on or turned off concurrently.

2. The switch device of claim 1, wherein the first switch control signal is the same as the second switch control signal, and the first sub-switch control signal is the same as the second sub-switch control signal.

3. The switch device of claim 1, wherein in a first transition period where the first switch control signal is transitioned from a first output signal level to a second output signal level, the first sub-switch control signal has a first pulse to turn on the first sub-switch unit.

4. The switch device of claim 3, further comprising:
a first control circuit coupled to the first terminal of the first resistor, the first terminal of the second resistor, the control terminal of the first sub-switch unit, and the control terminal of the second sub-switch unit, the first control circuit being configured to generate the first switch control signal, the second switch control signal, the first sub-switch control signal and the second sub-switch control signal according to a first input signal.

5. The switch device of claim 4, wherein the first control circuit comprises:
a first driver circuit configured to output the first switch control signal and the second switch control signal according to the first input signal; and
a first pulse generation circuit configured to output the first sub-switch control signal and the second sub-switch control signal according to the first input signal;
wherein in the first transition period, the first input signal is transitioned from a first input signal level to a second input signal level, and the first switch control signal is transitioned from the first output signal level to a third output signal level between the first output signal level and the second output signal level in a predetermined period;
in the first transition period and before the predetermined period, the first driver circuit outputs the first switch control signal having the first output signal level according to the first input signal level of the first input signal;
in the first transition period and after the first switch control signal has been transitioned from the first output signal level to the third output signal level, the first driver circuit outputs the first switch control signal having the second output signal level according to the second input signal level of the first input signal; and
the first pulse generation circuit generates the first pulse upon detecting that the first input signal has transitioned from the first input signal level to the second input signal level.

6. The switch device of claim 1, wherein the first reference voltage terminal comprises a ground terminal or a reference voltage terminal having a sourcing ability.

7. The switch device of claim 1, further comprising:
a third sub-switch unit comprising a first terminal coupled to the second terminal of the second sub-switch unit, a control terminal configured to receive a third sub-switch control signal, and a second terminal coupled to the first reference voltage terminal, wherein the second sub-switch unit is coupled to the first reference voltage terminal through the third sub-switch unit;
wherein when the first switch control signal is transitioned from a first signal level to a second signal level, the third sub-switch control signal has a third pulse to turn on the third sub-switch unit.

8. The switch device of claim 7, wherein the third sub-switch unit comprises n sub-switches and n sub-resistors, a first terminal and a second terminal of a kth sub-resistor are respectively coupled to a first terminal and a second terminal of a kth sub-switch, a control terminal of each of the n sub-switches is configured to receive the third sub-switch control signal, a first terminal of a first sub-switch is coupled to the first terminal of the third sub-switch unit, a second terminal of an ith sub-switch is coupled to a first terminal of an (i+1)th sub-switch, a second terminal of an nth sub-switch is coupled to the second terminal of the third sub-switch unit, n, k and i are integers, $0<k<(n+1)$ and $0<i<n$.

9. The switch device of claim 7, wherein the second sub-switch control signal is the same as the third sub-switch control signal.

10. The switch device of claim 7, further comprising:
a third switch unit comprising a first terminal coupled to the first radio frequency terminal, a control terminal, and a second terminal;
a fourth switch unit comprising a first terminal coupled to the second terminal of the third switch unit, a control terminal, and a second terminal coupled to a third radio frequency terminal;
a third resistor comprising a first terminal configured to receive a third switch control signal, and a second terminal coupled to the control terminal of the third switch unit;
a fourth resistor comprising a first terminal configured to receive a fourth switch control signal, and a second terminal coupled to the control terminal of the fourth switch unit;
a fourth sub-switch unit comprising a first terminal coupled to a node between the control terminal of the third switch unit and the third resistor, a control terminal configured to receive a fourth sub-switch control signal, and a second terminal;
a fifth sub-switch unit comprising a first terminal coupled to a node between the control terminal of the fourth switch unit and the fourth resistor, a control terminal configured to receive a fifth sub-switch control signal, and a second terminal; and
a sixth sub-switch unit comprising a first terminal coupled to the second terminal of the fifth sub-switch unit, a control terminal configured to receive a sixth sub-switch control signal, and a second terminal coupled to a second reference voltage terminal;
wherein the third switch unit and the fourth switch unit are controlled according to the third switch control signal and the fourth switch control signal respectively to be turned on or turned off concurrently, and the fourth sub-switch unit and the fifth sub-switch unit are controlled according to the fourth sub-switch control signal and the fifth sub-switch control signal respectively to be turned on or turned off concurrently; and
when the first switch control signal is transitioned from the first signal level to the second signal level, and the third switch control signal is transitioned from a third signal level to a fourth signal level, the fourth sub-switch control signal has a fourth pulse to turn on the fourth sub-switch unit, and the sixth sub-switch control signal has a sixth pulse to turn on the sixth sub-switch unit.

11. The switch device of claim 10, wherein the fourth sub-switch control signal is the same as the sixth sub-switch control signal.

12. The switch device of claim 10, wherein the sixth sub-switch unit comprises n sub-switches and n sub-resistors, a first terminal and a second terminal of a kth sub-resistor are respectively coupled to a first terminal and a second terminal of a kth sub-switch, a control terminal of each of the n sub-switches is configured to receive the sixth sub-switch control signal, a first terminal of a first sub-switch is coupled to the first terminal of the sixth sub-switch unit, a second terminal of an ith sub-switch is coupled to a first terminal of an (i+1)th sub-switch, a second terminal of an nth sub-switch is coupled to the second terminal of the sixth sub-switch unit, n, k and i are integers, $0<k<(n+1)$ and $0<i<n$.

13. The switch device of claim 1, further comprising:
   a third sub-switch unit comprising a first terminal coupled to the second terminal of the second sub-switch unit, a control terminal configured to receive a third sub-switch control signal, and a second terminal coupled to the first reference voltage terminal, wherein the second sub-switch unit is coupled to the first reference voltage terminal through the third sub-switch unit;
   a third switch unit comprising a first terminal coupled to the first radio frequency terminal, a control terminal, and a second terminal;
   a fourth switch unit comprising a first terminal coupled to the second terminal of the third switch unit, a control terminal, and a second terminal coupled to a third radio frequency terminal;
   a third resistor comprising a first terminal configured to receive a third switch control signal, and a second terminal coupled to the control terminal of the third switch unit;
   a fourth resistor comprising a first terminal configured to receive a fourth switch control signal, and a second terminal coupled to the control terminal of the fourth switch unit;
   a fourth sub-switch unit comprising a first terminal coupled to a node between the control terminal of the third switch unit and the third resistor, a control terminal configured to receive a fourth sub-switch control signal, and a second terminal; and
   a fifth sub-switch unit comprising a first terminal coupled to a node between the control terminal of the fourth switch unit and the fourth resistor, a control terminal configured to receive a fifth sub-switch control signal, and a second terminal;
   a sixth sub-switch unit comprising a first terminal coupled to the second terminal of the fifth sub-switch unit, a control terminal configured to receive a sixth sub-switch control signal, and a second terminal coupled to a second reference voltage terminal; and
   a seventh sub-switch unit comprising a first terminal coupled to the first terminal of the third sub-switch unit, a control terminal configured to receive a seventh sub-switch control signal, and a second terminal coupled to the first terminal of the sixth sub-switch unit;
   wherein the third switch unit and the fourth switch unit are controlled according to the third switch control signal and the fourth switch control signal respectively to be turned on or turned off concurrently, and the fourth sub-switch unit and the fifth sub-switch unit are controlled according to the fourth sub-switch control signal and the fifth sub-switch control signal respectively to be turned on or turned off concurrently.

14. The switch device of claim 13, wherein each of the first reference voltage terminal and the second reference voltage terminal comprises a ground terminal or a reference voltage terminal having a sourcing ability.

15. The switch device of claim 13, wherein when the first switch control signal is transitioned from a first signal level to a second signal level, and the third switch control signal is transitioned from a third signal level to a fourth signal level;
   in a first period, the first sub-switch control signal and the second sub-switch control signal are controlled to turn on the first sub-switch unit and the second sub-switch unit, the third sub-switch control signal is controlled to turn on the third sub-switch unit, the fourth sub-switch control signal and the fifth sub-switch control signal are controlled to turn on the fourth sub-switch unit and the fifth sub-switch unit, the sixth sub-switch control signal is controlled to turn on the sixth sub-switch unit, and the seventh sub-switch control signal is controlled to turn off the seventh sub-switch unit; and
   in a second period following the first period, the first sub-switch control signal and the second sub-switch control signal are controlled to turn on the first sub-switch unit and the second sub-switch unit, the third sub-switch control signal is controlled to turn off the third sub-switch unit, the fourth sub-switch control signal and the fifth sub-switch control signal are controlled to turn on the fourth sub-switch unit and the fifth sub-switch unit, the sixth sub-switch control signal is controlled to turn off the sixth sub-switch unit, and the seventh sub-switch control signal is controlled to turn on the seventh sub-switch unit.

16. The switch device of claim 13, wherein when the first switch control signal is transitioned from a first signal level to a second signal level, and the third switch control signal is transitioned from a third signal level to a fourth signal level:
   in a first period, the first sub-switch control signal and the second sub-switch control signal are controlled to turn on the first sub-switch unit and the second sub-switch unit, the third sub-switch control signal is controlled to turn off the third sub-switch unit, the fourth sub-switch control signal and the fifth sub-switch control signal are controlled to turn on the fourth sub-switch unit and the fifth sub-switch unit, the sixth sub-switch control signal is controlled to turn off the sixth sub-switch unit, and the seventh sub-switch control signal is controlled to turn on the seventh sub-switch unit; and
   in a second period following the first period, the first sub-switch control signal and the second sub-switch control signal are controlled to turn on the first sub-switch unit and the second sub-switch unit, the third sub-switch control signal is controlled to turn on the third sub-switch unit, the fourth sub-switch control signal and the fifth sub-switch control signal are controlled to turn on the fourth sub-switch unit and the fifth sub-switch unit, the sixth sub-switch control signal is controlled to turn on the sixth sub-switch unit, and the seventh sub-switch control signal is controlled to turn off the seventh sub-switch unit.

17. The switch device of claim 13, wherein the seventh sub-switch unit comprises n sub-switches and n sub-resistors, a first terminal and a second terminal of a kth sub-resistor are respectively coupled to a first terminal and a second terminal of a kth sub-switch, a control terminal of each of the n sub-switches is configured to receive the seventh sub-switch control signal, a first terminal of a first sub-switch is coupled to the first terminal of the seventh sub-switch unit, a second terminal of an ith sub-switch is coupled to a first terminal of an (i+1)th sub-switch, a second terminal of an nth sub-switch is coupled to the second terminal of the seventh sub-switch unit, n, k and i are integers, $0<k<(n+1)$ and $0<i<n$.

18. A switch device, comprising:
a first switch unit comprising a first terminal coupled to a first radio frequency terminal, a control terminal, and a second terminal;
a second switch unit comprising a first terminal coupled to the second terminal of the first switch unit, a control terminal, and a second terminal coupled to a second radio frequency terminal;
a first resistor comprising a first terminal configured to receive a first switch control signal, and a second terminal coupled to the control terminal of the first switch unit;
a second resistor comprising a first terminal configured to receive a second switch control signal, and a second terminal coupled to the control terminal of the second switch unit;
a first sub-switch unit comprising a first terminal coupled to a node between the control terminal of the first switch unit and the first resistor, a control terminal configured to receive a first sub-switch control signal, and a second terminal;
a second sub-switch unit comprising a first terminal coupled to a node between the control terminal of the second switch unit and the second resistor, a control terminal configured to receive a second sub-switch control signal, and a second terminal;
a third switch unit comprising a first terminal coupled to the first radio frequency terminal, a control terminal, and a second terminal;
a fourth switch unit comprising a first terminal coupled to the second terminal of the third switch unit, a control terminal, and a second terminal coupled to a third radio frequency terminal;
a third resistor comprising a first terminal configured to receive a third switch control signal, and a second terminal coupled to the control terminal of the third switch unit;
a fourth resistor comprising a first terminal configured to receive a fourth switch control signal, and a second terminal coupled to the control terminal of the fourth switch unit;
a third sub-switch unit comprising a first terminal coupled to a node between the control terminal of the third switch unit and the third resistor, a control terminal configured to receive a third sub-switch control signal, and a second terminal;
a fourth sub-switch unit comprising a first terminal coupled to a node between the control terminal of the fourth switch unit and the fourth resistor, a control terminal configured to receive a fourth sub-switch control signal, and a second terminal; and
a fifth sub-switch unit comprising a first terminal coupled to the second terminal of the second sub-switch unit, a control terminal configured to receive a fifth sub-switch control signal, and a second terminal coupled to the second terminal of the fourth sub-switch unit;
wherein the first switch unit and the second switch unit are controlled according to the first switch control signal and the second switch control signal respectively to be turned on or turned off concurrently, and the first sub-switch unit and the second sub-switch unit are controlled according to the first sub-switch control signal and the second sub-switch control signal respectively to be turned on or turned off concurrently;
wherein the third switch unit and the fourth switch unit are controlled according to the third switch control signal and the fourth switch control signal respectively to be turned on or turned off concurrently, and the third sub-switch unit and the fourth sub-switch unit are controlled according to the third sub-switch control signal and the fourth sub-switch control signal respectively to be turned on or turned off concurrently.

19. The switch device of claim 18, wherein the first switch control signal is the same as the second switch control signal, the third switch control signal is the same as the fourth switch control signal, the first sub-switch control signal is the same as the second sub-switch control signal, and the third sub-switch control signal is the same as the fourth sub-switch control signal.

20. The switch device of claim 19, wherein when the first switch control signal is transitioned from a first output signal level to a second output signal level, and the third switch control signal is transitioned from a third output signal level to a fourth output signal level, the first sub-switch control signal has a first pulse to turn on the first sub-switch unit, the third sub-switch control signal has a second pulse to turn on the third sub-switch unit, and the fifth sub-switch control signal has a third pulse to turn on the fifth sub-switch unit.

* * * * *